(12) United States Patent
Nuttall et al.

(10) Patent No.: US 6,417,015 B2
(45) Date of Patent: *Jul. 9, 2002

(54) SEMICONDUCTOR PROCESSING METHODS AND SEMICONDUCTOR DEFECT DETECTION METHODS

(75) Inventors: Michael Nuttall; Garry A. Mercaldi, both of Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/870,157

(22) Filed: May 29, 2001

Related U.S. Application Data

(63) Continuation of application No. 09/126,983, filed on Jul. 30, 1998, now Pat. No. 6,251,693.

(51) Int. Cl.[7] .......................... H01L 21/66; G01R 31/26
(52) U.S. Cl. .......................... 438/14; 438/928; 438/974
(58) Field of Search .......................... 438/14, 974, 928, 438/8, 687

(56) References Cited

U.S. PATENT DOCUMENTS

| | | | |
|---|---|---|---|
| 4,597,989 A | | 7/1986 | Wonsowicz |
| 4,963,506 A | | 10/1990 | Liaw et al. |
| 5,080,933 A | | 1/1992 | Grupen-Shemansky |
| 5,818,100 A | | 10/1998 | Grider et al. |
| 5,980,720 A | | 11/1999 | Park et al. |
| 6,118,280 A | | 9/2000 | Matsunaga et al. |
| 6,159,852 A | | 12/2000 | Nuttall et al. |
| 6,174,727 B1 | | 1/2001 | Homma et al. |
| 6,251,693 B1 | * | 6/2001 | Nuttall et al. ................. 438/14 |

OTHER PUBLICATIONS

Violette, Katherine E., et al., "Low Temperature Selective Silicon Epitaxy By Ultra High Vacuum Rapid Thermal Chemical Vapor Deposition Using $Si_2H_6$, $H_2$ and $Cl_2$",*Appl. Phys. Lett.*, vol. 68(1), pp. 66–68 (Jan. 1996).

Rai K.V., "Imperfections and Impurities in Semiconductor Silicon", *Mobil Tyco Solar Energy Corp.*, 1981, pp. 67–69, 90–100, and 166–172. Wolf, Stanley, "Silicon Processing for the VLSI Era vol. 2—Process Integration", pp. 434–435, 1990.

* cited by examiner

*Primary Examiner*—Michael S. Lebentritt
*Assistant Examiner*—Brad Smith
(74) *Attorney, Agent, or Firm*—Wells St. John P.S.

(57) ABSTRACT

Semiconductor processing methods and defect detection methods are described. In one embodiment, a semiconductor wafer in process is provided and a material is formed or deposited over the wafer. The material is discernably deposited over defective wafer surface areas and not appreciably deposited over non-defective wafer surface areas. Subsequently, the wafer surface areas are inspected to identify defective areas. In another embodiment, a substrate is provided having an exposed region containing surface defects. A defect-highlighting material is substantially selectively deposited over surface defects and not appreciably over other exposed regions. The substrate is subsequently inspected for the deposited defect-highlighting material. In yet another embodiment, a dielectric layer is formed over a substrate outer surface and the substrate is processed in a manner which can give rise to a plurality of randomly-distributed dielectric layer features. A silicon-containing material is substantially selectively deposited and received over the randomly distributed dielectric layer features and not over other substrate areas. The substrate is subsequently inspected for the selectively-deposited silicon containing material.

20 Claims, 3 Drawing Sheets

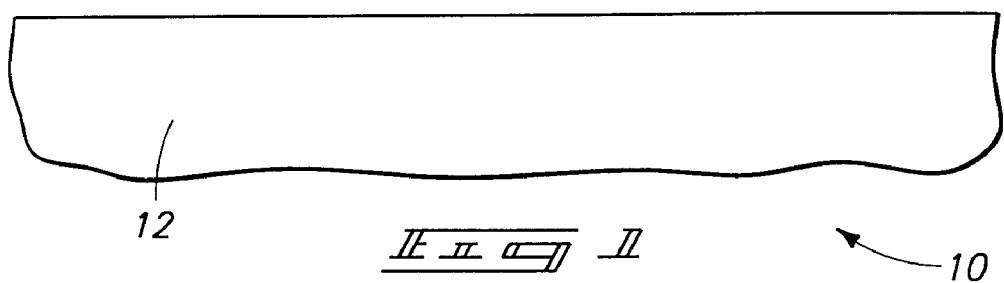
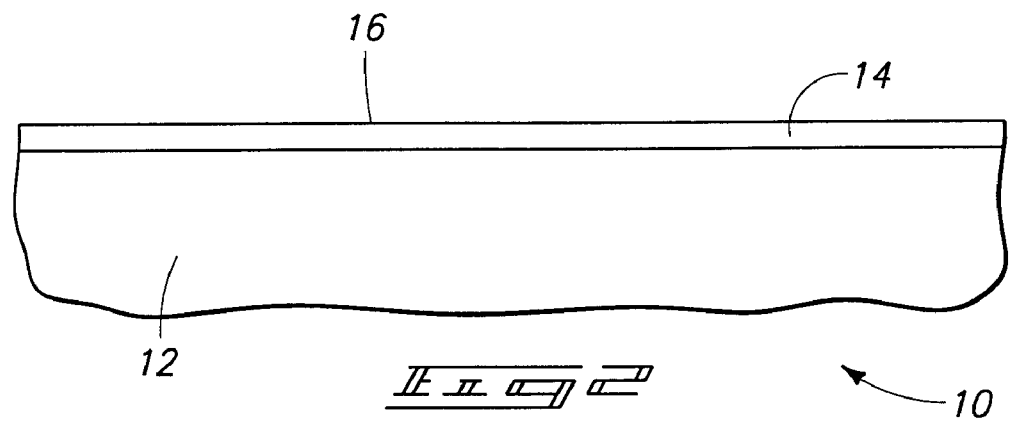
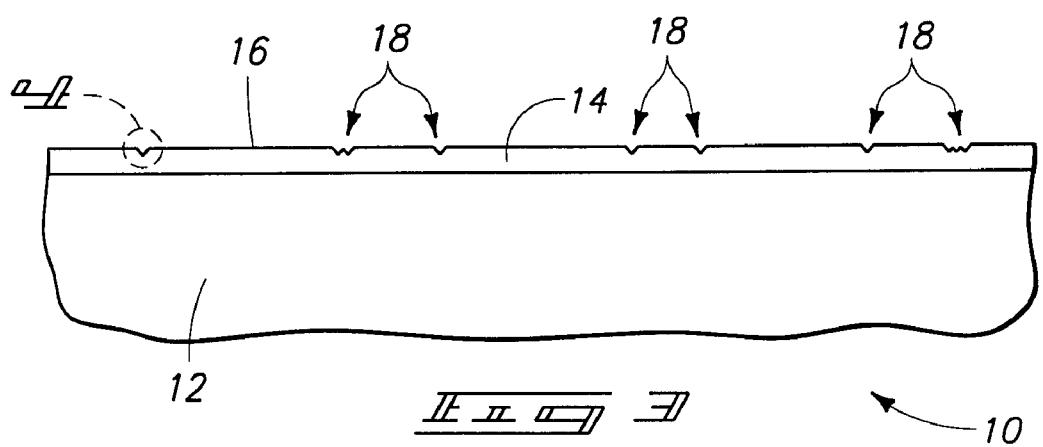

SEMICONDUCTOR PROCESSING METHODS AND SEMICONDUCTOR DEFECT DETECTION METHODS

RELATED PATENT DATA

This patent resulted from a continuation application of U.S. patent application Ser. No. 09/126,983, filed Jul. 30, 1998, entitled "Semiconductor Processing Methods and Semiconductor Defect Detection Methods", naming Michael Nuttall as inventor, now U.S. Pat. No. 6,251,693, the disclosure of which is incorporated by reference.

TECHNICAL FIELD

The present invention relates to semiconductor processing methods and semiconductor defect detection methods.

BACKGROUND OF THE INVENTION

Semiconductor processing typically includes forming a plurality of layers over a substrate such as a monocrystalline silicon wafer. During processing, the layers are typically etched into and formed to include various integrated circuit components such as conductive lines, transistor gate lines, resistors, capacitors, and the like. During processing, anomalies in the various layers can occur which can adversely affect the finished device. Yet, it is often not possible to detect such anomalies until a finished device is electronically tested. Anomalies or defects can be caused by mechanical and/or chemical sources.

For example, sometimes during the handling of a wafer in process, the wafer handling apparatus can cause a physical surface defect which can adversely impact a finished device. Alternately, some aspects of chemical processing can adversely affect various layers of the wafer. If a number of such devices are contemporaneously fabricated, anomalies or defects which present themselves early in the processing can have an effect which promulgates its way through all of the devices. Yet, early detection of such anomalies could allow for preventative measures to be taken. An exemplary layer which can be adversely affected during processing by such anomalies or defects is a gate oxide layer for a transistor. Accordingly, it would be desirable to be able to determine the presence of anomalies or defects, midstream during the processing flow.

This invention arose out of concerns associated with providing improved methods of semiconductor processing, and in particular, improved methods of semiconductor defect detection.

SUMMARY OF THE INVENTION

Semiconductor processing methods and defect detection methods are described. In one embodiment, a semiconductor wafer in process is provided and a material is formed or deposited over the wafer. The material is discernably deposited over defective wafer surface areas and not appreciably deposited over nondefective wafer surface areas. Subsequently, the wafer surface areas are inspected to identify defective areas. In another embodiment, a substrate is provided having an exposed region containing surface defects. A defect-highlighting material is substantially selectively deposited over surface defects and not appreciably over other exposed regions. The substrate is subsequently inspected for the deposited defect-highlighting material. In yet another embodiment, a dielectric layer is formed over a substrate outer surface and the substrate is processed in a manner which can give rise to a plurality of randomly-distributed dielectric layer features. A silicon-containing material is substantially selectively deposited and received over the randomly-distributed dielectric layer features and not over other substrate areas. The substrate is subsequently inspected for the selectively-deposited silicon-containing material.

BRIEF DESCRIPTION OF THE DRAWINGS

Preferred embodiments of the invention are described below with reference to the following accompanying drawings.

FIG. 1 is a diagrammatic side sectional view of a semiconductor wafer fragment in process in accordance with one embodiment of the invention.

FIG. 2 is a view of the FIG. 1 wafer fragment at a processing step which is subsequent to that which is shown in FIG. 1.

FIG. 3 is a view of the FIG. 1 wafer fragment at a processing step which is subsequent to that which is shown in FIG. 2.

DETAILED DESCRIPTION OF THE PREFERRED EMBODIMENTS

Figure 4:
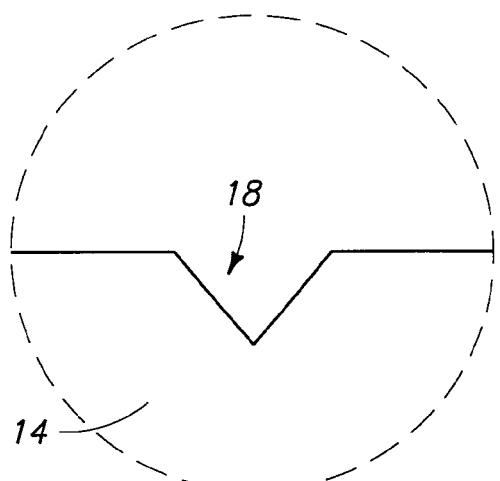
FIG. 4 is an enlarged view of a portion of the FIG. 3 wafer fragment.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is shown generally at 10 and includes semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Referring to FIG. 2, a material layer 14 is formed over substrate 12 and includes an outer surface 16. In one embodiment, layer 14 comprises an insulative material. Exemplary materials include various nitrides. In another embodiment, layer 14 comprises an oxide layer. In a more preferred embodiment, layer 16 comprises a gate oxide layer for a transistor which is to be subsequently formed.

Referring to FIG. 3, exposed regions of outer surface 16 are seen to include a plurality of features 18. In one embodiment, features 18 comprise surface defects which are desired to be identified. Such surface defects can be caused by processing the substrate in a manner which can give rise to them, as through mechanical processing, chemical processing, and/or combinations of both.

In the illustrated embodiment, a plurality of randomly-distributed features are undesirably provided within layer 14. An undesirable aspect of features 18 is that, in the past, they have been difficult, if not impossible to identify during processing of the semiconductor wafer. That is, not only can such features be impossible to visually identify, but often times will not show up when magnified as by a scanning electron micrograph. Hence, such features are normally only identified inferentially by the impact they have on the operation of a finished device. Needless to say, this is highly undesirable, inconvenient and costly.

Figure 5:
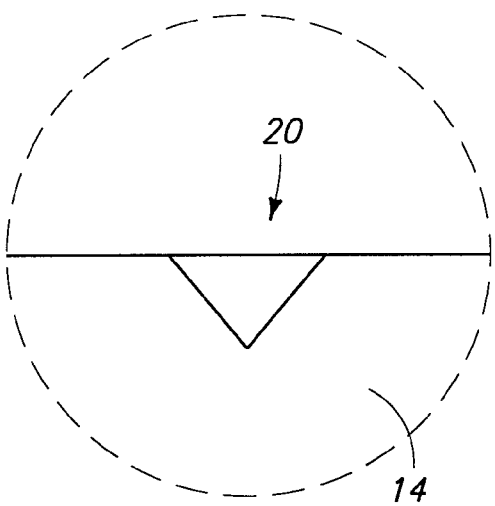
FIG. 5 is an enlarged view similar to that of FIG. 4.

Referring to FIGS. 4 and 5, FIG. 4 shows an enlarged portion of a defect 18 from FIG. 3. For illustrative purposes only, defect 18 is shown to be received within layer 14 and can exemplify a mechanical defect. The defect could, by way of example only, be a projection from the outer wafer surface. FIG. 5 shows a different type of defect at 20 and can exemplify a defect which is crystallographic, contaminant, or chemical in nature.

Figure 6:
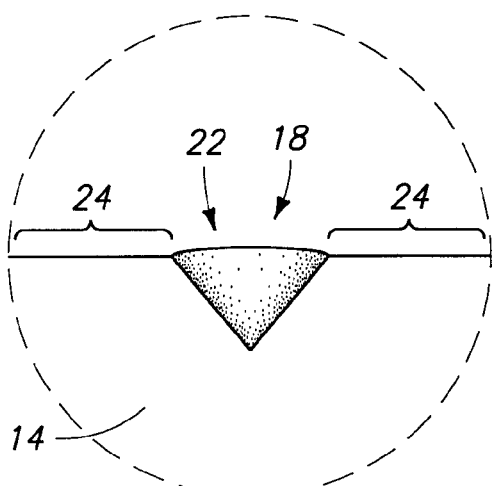
FIG. 6 is a view of the FIG. 4 wafer fragment portion at a processing step which is subsequent to that which is shown in FIG. 4.

Referring to FIG. 6, a material 22 is deposited over the wafer and, in particular, over defect 18. Preferably, material 22 is discernably deposited over defective wafer surface areas and not appreciably deposited over nondefective wafer surface areas, such as surface areas 24. In one embodiment, the depositing of material 22 comprises chemical vapor depositing a silicon-containing material. In another, more preferred embodiment, the depositing of material 22 comprises chemical vapor depositing polysilicon.

Alternately considered, material 22 constitutes a defect-highlighting material which is deposited substantially selectively over surface defects and not appreciably over other exposed regions. In the context of this document, "substantially selective" or "substantially selectively" denotes deposition over one region as compared to another to a thickness ratio greater than or equal to 5:1.

In another embodiment, material 22 constitutes a crystallographic-defect-identifying layer which is formed over the semiconductor wafer. After formation, the wafer can be inspected for crystallographic defects which are set off by the layer. Crystallographic defects can include point defects, line defects, and slip defects. In a preferred embodiment, the wafer is inspected for slip defects, with the crystallographic-defect-identifying layer being selectively deposited over such defects and not appreciably over other regions of the wafer as described below. Inspection of the wafer can take place through a visual inspection or through automated inspection.

In a preferred chemical vapor depositing embodiment, the depositing of the silicon-containing material comprises exposing the substrate to chemical vapor depositing conditions within a hot wall low pressure reactor, effective to deposit the silicon-containing material. A gaseous precursor of silicon is fed into the reactor under conditions which are effective to deposit the silicon-containing material. Exemplary processing conditions are disclosed in commonly-assigned U.S. patent application Ser. No. 09/023,239, the disclosure of which is incorporated by reference herein.

Exemplary and suitable conditions within the preferred hot wall low pressure reactor comprise, in one embodiment, temperatures greater than or equal to about 650° C., and pressure less than or equal to about 100 mTorr. In another embodiment, deposition conditions comprise temperatures from between about 650° C. and 850° C., and pressure from between about 30 mTorr and 100 mTorr. Exemplary gaseous precursors include silane and chlorosilane. Specific examples include $SiH_4$, $Si_2H_6$, and $SiCl_2H_2$. A suitable reactor is the ASM 600 furnace, and suitable processing parameters include 50 sccm silane, at 700° C., 70 mTorr for 7 minutes.

Figure 7:
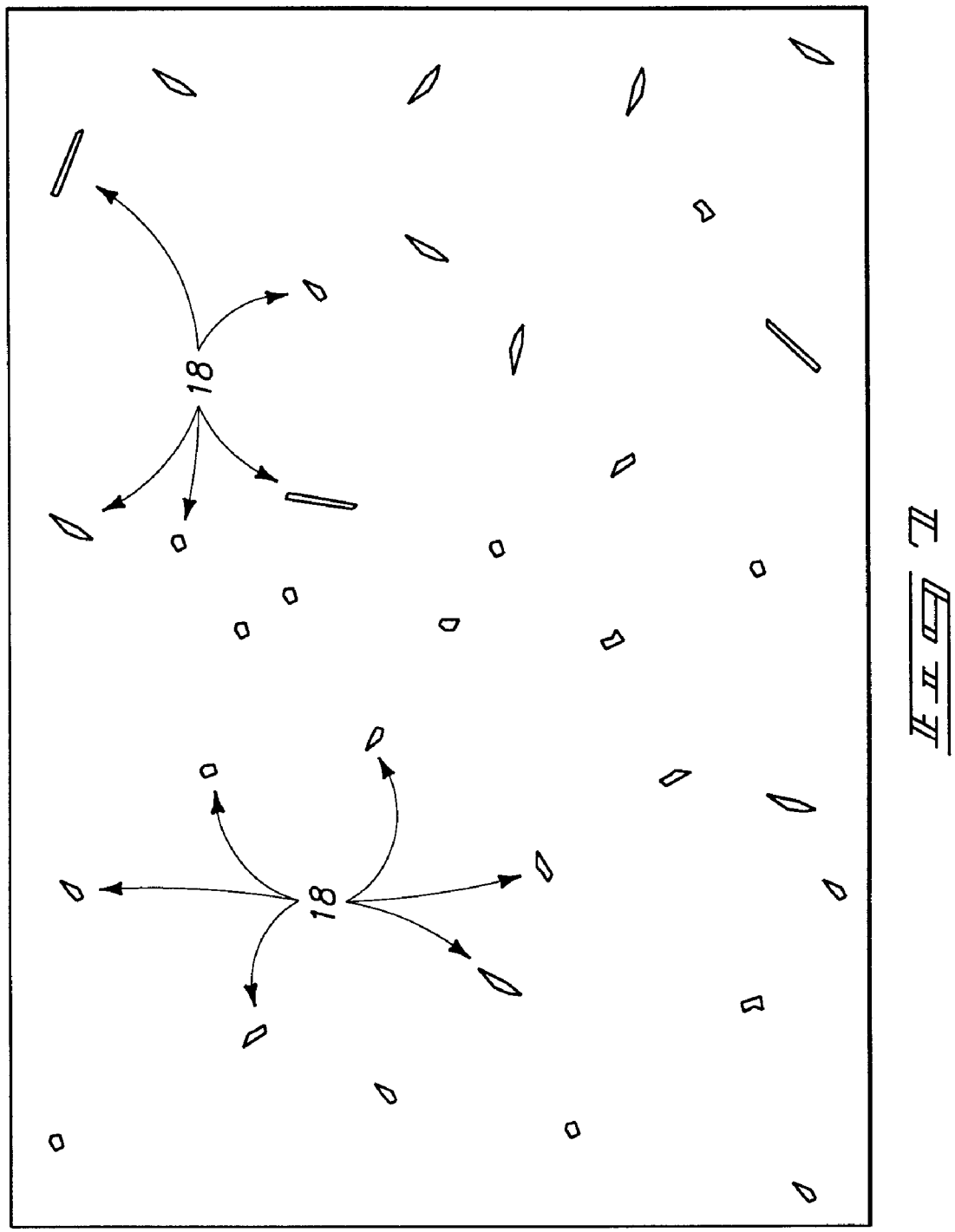
FIG. 7 is a top plan view of a portion of a semiconductor wafer in accordance with one embodiment of the invention.

Referring to FIG. 7, and with processing having been completed as described above, substrate 12 can be inspected to identify defective wafer surface areas occupied by the defect-highlighting material. Such inspection can take place visually with the naked eye, through the use of optical inspection equipment such as automated equipment available through companies such as Tencor or KLA, or through non-optical equipment such as through atomic force microscopy (AFM).

FIG. 7 shows a plurality of discrete defects 18 over which are formed specks of visually-identifiable material. Advantages of the present invention include the ability to monitor gate oxide defect densities, cell nitride defect densities, and various other previously non-visually-perceptible defects.

In a reduction-to-practice example, oxide test wafers having around 1000 Angstrom of thermally grown oxide on a silicon surface were provided. One of the test wafers received a selective deposition after it was handled with a wafer-handling wand. The wafer-handling wand was utilized to impart surface defects to the oxide. After handling, material was observed both through a microscope and with the naked eye to be deposited within the wand's footprint and over surface defects, and not appreciably over other surface areas.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor defect detection method comprising:
   providing a semiconductor wafer having an outer surface;
   exposing the outer surface to conditions effective for depositing a polycrystalline material, the material being discernably deposited over defective areas and not appreciably deposited over non-defective areas; and
   identifying defective areas.

2. The semiconductor defect detection method of claim 1, wherein the exposing comprises providing conditions effective for chemical vapor depositing a silicon-containing material.

3. The semiconductor defect detection method of claim 1, wherein the exposing comprises providing conditions effective for chemical vapor depositing polysilicon.

4. The semiconductor defect detection method of claim 1, wherein the exposing comprises providing a gaseous precursor of silicon to the outer surface at a temperature greater than or equal to about 650° C., and at a pressure less than or equal to about 100 mTorr.

5. The semiconductor defect detection method of claim 1, wherein the exposing comprises providing a gaseous precursor of silicon to the outer surface at a temperature between about 650° C. and 850° C., and at a pressure between about 30 mTorr and 100 mTorr.

6. The semiconductor defect detection method of claim 1, wherein providing a semiconductor wafer having an outer surface comprises forming an oxide layer over at least a portion of the outer surface.

7. The semiconductor defect detection method of claim 1, wherein providing a semiconductor wafer having an outer surface comprises forming a gate oxide layer over at least a portion of the outer surface.

8. The semiconductor defect detection method of claim 1, wherein providing a semiconductor wafer having an outer surface comprises forming a gate oxide layer over at least a portion of the outer surface and the exposing comprises providing a gaseous precursor of silicon to the outer surface at a temperature between about 650° C. and 850° C., and at a pressure between about 30 mTorr and 100 mTorr.

9. A semiconductor defect detection method comprising:

providing a substrate having an essentially planar exposed region containing surface defects;

substantially selectively chemical vapor depositing a defect-highlighting material layer over the surface defects and not appreciably over other exposed regions; and inspecting the substrate for the deposited defect-highlighting material.

10. The semiconductor defect detection method of claim 9, wherein the depositing of the defect-highlighting material comprises depositing a silicon-containing material.

11. The semiconductor defect detection method of claim 9, wherein the depositing of the defect-highlighting material comprises depositing polycrystalline silicon.

12. A semiconductor processing method comprising:

forming a dielectric layer over a substrate outer surface;

processing the substrate in a manner which can give rise to a plurality of randomly-distributed dielectric layer features;

exposing the substrate to conditions which provide discernable deposition of a silicon-containing material, essentially only over said randomly-distributed dielectric layer features; and inspecting the substrate to identify discernable deposition of the silicon-containing material.

13. The semiconductor processing method of claim 12, wherein the forming comprises forming a gate dielectric layer.

14. The semiconductor processing method of claim 12, wherein the exposing of the substrate comprises:

providing the substrate within a chemical vapor deposition reactor; and feeding a gaseous precursor of silicon into the reactor under conditions effective to deposit polysilicon, the conditions comprising a temperature greater than or equal to about 650° C., and a pressure less than or equal to about 100 mTorr.

15. The semiconductor processing method of claim 12, wherein the exposing of the substrate comprises:

providing the substrate within a chemical vapor deposition reactor; and feeding a gaseous precursor of silicon into the reactor under conditions effective to deposit polysilicon, the conditions comprising a temperature between about 650° C. and 850° C., and a pressure between about 30 mTorr and 100 mTorr.

16. A semiconductor processing method comprising:

forming a dielectric layer over a substrate outer surface, the dielectric layer having at least two discrete dielectric layer features which are desired to be identified; and substantially selectively depositing a material over the dielectric layer, the substantially selective depositing highlighting the at least two discrete dielectric layer features.

17. The semiconductor processing method of claim 16, wherein the forming of the dielectric layer comprises forming a gate dielectric layer.

18. The semiconductor processing method of claim 17, wherein the depositing of the material over the substrate comprises depositing a silicon-containing material over the gate dielectric layer.

19. The semiconductor processing method of claim 16, wherein the depositing of the material over the substrate comprises:

providing the substrate within a chemical vapor deposition reactor; and feeding a gaseous precursor of silicon into the reactor under conditions effective to deposit polysilicon, the conditions comprising a temperature greater than or equal to about 650° C., and a pressure less than or equal to about 100 mTorr.

20. The semiconductor processing method of claim 16, wherein the depositing of the material over the substrate comprises depositing a polycrystalline silicon-containing material over the substrate.

* * * * *